United States Patent [19]

Sugiyama

[11] Patent Number: 4,576,052

[45] Date of Patent: Mar. 18, 1986

[54] SEMICONDUCTOR TRANSDUCER

[75] Inventor: Susumu Sugiyama, Aichi, Japan

[73] Assignee: Kabushiki Kaisha Toyota Chuo Kenkyusho, Aichi, Japan

[21] Appl. No.: 613,968

[22] Filed: May 24, 1984

[30] Foreign Application Priority Data

May 26, 1983 [JP] Japan .................................. 58-91443

[51] Int. Cl.$^4$ .......................... G01D 3/04; G01L 9/06
[52] U.S. Cl. .................................... 73/862.63; 73/727
[58] Field of Search ..................... 73/766, 862.63, 720, 73/721, 726, 727

[56] References Cited

U.S. PATENT DOCUMENTS 3,836,796 9/1974 Solomon et al. ...................... 73/766
4,333,349 6/1982 Mallon et al. .......................... 73/727
4,462,018 7/1984 Yang et al. ............................. 73/766

Primary Examiner—Anthony V. Ciarlante

[57] ABSTRACT

A semiconductor transducer has a strain sensitive region, at least one strain gage formed integrally with a major surface of the strain sensitive region corresponding to a major surface of a monocrystalline silicon substrate, a bridge circuit including the strain gage, an operational amplifier, an input terminal of which is connected to an output terminal of the bridge circuit, and parallel-connected resistors which are integrally formed on the major surface of the monocrystalline silicon substrate and each of which has two ends connected to the input terminal and an output terminal of the operational amplifier, respectively, the strain sensitive region, the strain gage, the operational amplifier and the parallel-connected resistors being formed on the monocrystalline silicon substrate, wherein a difference between a temperature coefficient of resistance of the strain gage and a temperature coefficient of sensitivity thereof is set to be substantially the same as a temperature coefficient of resistance of the parallel-connected resistors. Resistors connected in series with the input terminals of the operational amplifier can thus be eliminated. The resistance of the parallel-connected resistors can be decreased, thereby providing a compact, highly integrated arrangement. In addition, a temperature compensator need not be used to compensate for the sensitivity.

24 Claims, 11 Drawing Figures

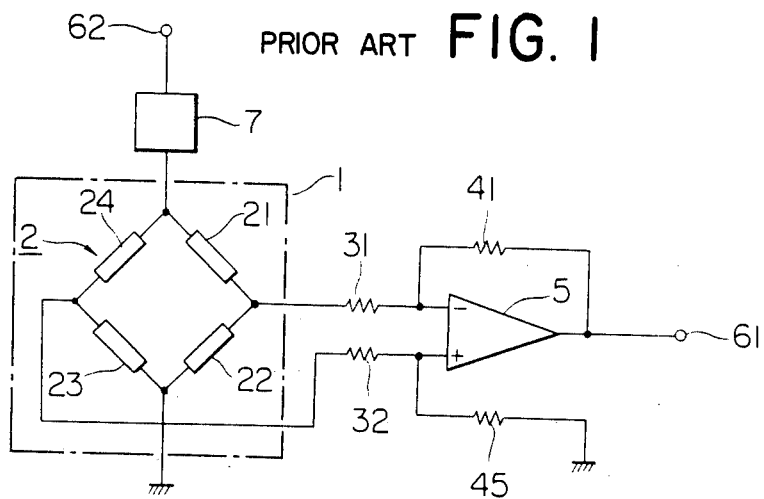
PRIOR ART FIG. 1
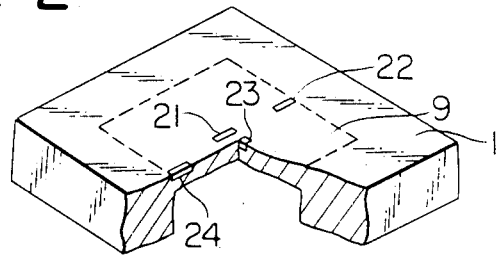
PRIOR ART FIG. 2
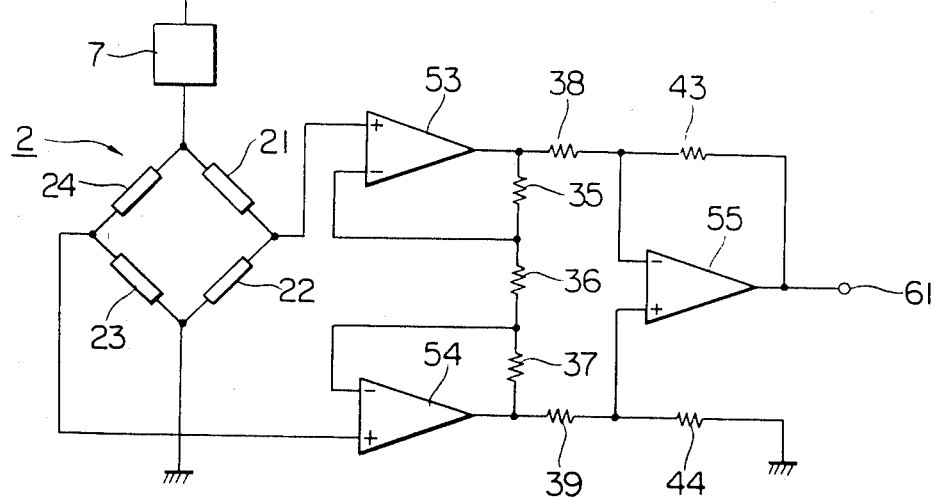
PRIOR ART FIG. 3

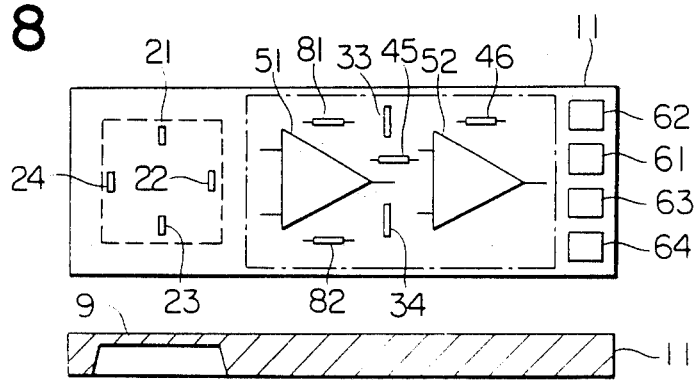
FIG. 8
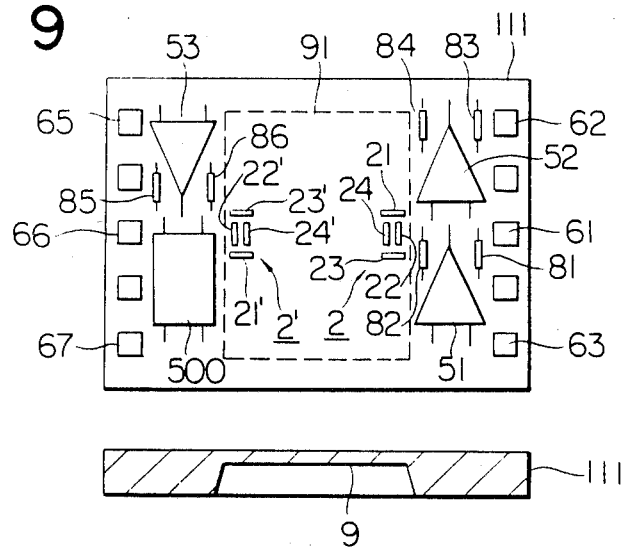
FIG. 9
FIG. 10
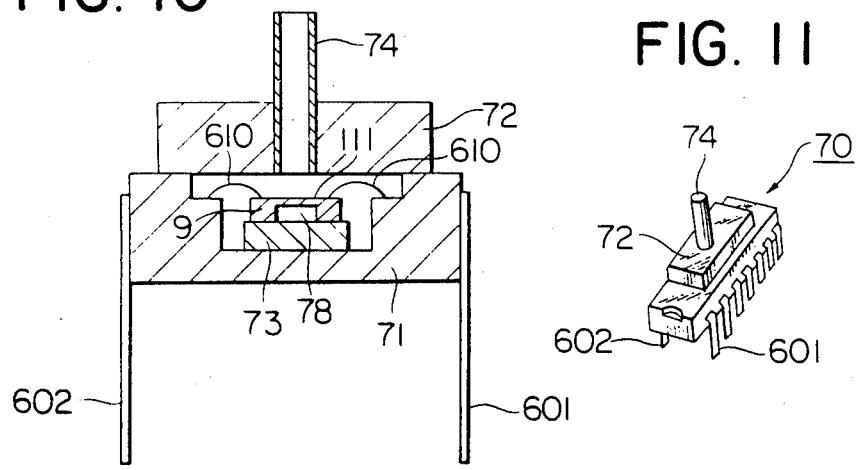
FIG. 11

SEMICONDUCTOR TRANSDUCER

BACKGROUND OF THE INVENTION

I. Field of the Invention

The present invention relates to an improvement in a semiconductor transducer using monocrystalline silicon and, more particularly, to a compact, highly integrated semiconductor transducer.

II. Brief Description of the Prior Art

In a conventional semiconductor transducer, a plurality of diffusion strain gages which constitute a bridge circuit are formed on a monocrystalline silicon diaphragm to detect a pressure. An output from the bridge circuit is amplified by a differential amplifier which then generates a voltage in proportion to the detected pressure. The composite resistance of the strain gages in the bridge circuit is too large to be neglected as compared with the input impedance of the differential amplifier, so that the gain of the differential amplifier is lowered due to its connection with the bridge circuit. In order to prevent this decrease in gain, conventionally, the input resistance of the differential amplifier is set to be large. Alternatively, for this purpose, a high-input resistance amplifier circuit constituted by a plurality of operational amplifiers is used.

However, when the differential amplifier portion is integrally formed with the strain gages on a single monocrystalline silicon substrate, a large space is required for the differential amplifier portion since it has a high resistance and a complex construction. As a result, a compact semiconductor transducer cannot be prepared.

In addition, since the temperature coefficient of the resistance of a resistor used in the differential amplifier generally differs from that of the strain gage, the gain of the differential amplifier tends to change in accordance with temperature changes in the conventional semiconductor transducer. In order to compensate for the changes in gain due to such temperature changes, a complicated temperature compensator must be used. In addition to this disadvantage, this compensator cannot be operated with high precision in a wide range of temperature changes.

SUMMARY OF THE INVENTION

The present invention seeks to solve these conventional problems, and has as its object to provide a compact, highly integrated semiconductor transducer and, more particularly, to provide a compact, highly integrated, highly precise semiconductor transducer capable of obtaining a desired gain without increasing the resistance of a differential amplifier, of compensating for a decrease in temperature sensitivity of strain gages without the need for a special compensator, and of decreasing the number of circuit elements required.

A semiconductor transducer according to the present invention comprises, on a monocrystalline silicon substrate, a strain sensitive region, at least one strain gage formed integrally with a major surface of the strain sensitive region corresponding to that of the monocrystalline silicon substrate, a bridge circuit including the strain gage, an operational amplifier, an input terminal of which is connected to an output terminal of the bridge circuit, and parallel-connected resistors which are integrally formed of the major surface of the monocrystalline silicon substrate and each of which has two ends connected to the input terminal and an output terminal of the operational amplifier, respectively, wherein the difference between the temperature coefficient of resistance of the strain gage and the temperature coefficient of sensitivity thereof is set to be substantially the same as the temperature coefficient of resistance of the parallel-connected resistors. The respective coefficients are preset as described above, so that the resistors, which are conventionally series-connected between the bridge circuit and the operational amplifier, can be removed. For this reason, the resistance of the parallel-connected resistors can be decreased. The area needed for these resistors on the substrate can be decreased, thereby providing a compact transducer. In addition, when the respective coefficients are preset as described above, a special temperature compensator need not be used. This omission, in addition to that of the series-connected resistors, means that an even more compact, and more highly integrated transducer can be prepared so as to perform highly precise transducing operations.

According to an aspect of the present invention, there is provided a semiconductor transducer, wherein the monocrystalline silicon substrate has a second conduction type, an epitaxial layer of a first conduction type is formed of the substrate so as to constitute the major surface, the strain gage and the parallel-connected resistor are of the second conduction type, and the operational amplifier is integrally formed on the major surface of the monocrystalline silicon substrate.

The respective coefficients are selected, as needed, in accordance with surface impurity concentrations. More particularly, the surface impurity concentration of the parallel-connected resistor is selected to be lower than that of the strain gage. The surface impurity concentration of the strain gage is preferably set at $10^{16}$ to $10^{21}$ atoms/cm$^3$. In this manner, the respective coefficients can be selected in accordance with a wide range of surface impurity concentrations. Therefore, a large margin can be secured although variations may occur during the fabrication process, thereby resulting in low cost.

BRIEF DESCRIPTION OF THE DRAWINGS

FIG. 1 is a circuit diagram showing an equivalent circuit of a conventional semiconductor transducer;

FIG. 2 is a partially cutaway perspective view of the conventional semiconductor transducer shown in FIG. 1;

FIG. 3 is a circuit diagram showing an equivalent circuit of another conventional semiconductor transducer;

FIG. 8 is a schematic representation of the circuit of the second embodiment and its corresponding section;

FIG. 9 is a schematic representation of the circuit arrangement of a third embodiment and its corresponding longitudinal section;

FIG. 10 is a sectional view of a package including the semiconductor transducer of the present invention; and FIG. 11 is a perspective view showing the outer appearance of the package shown in FIG. 10.

DETAILED DESCRIPTION OF THE INVENTION

I. Description of the Prior Art

Figure 4:
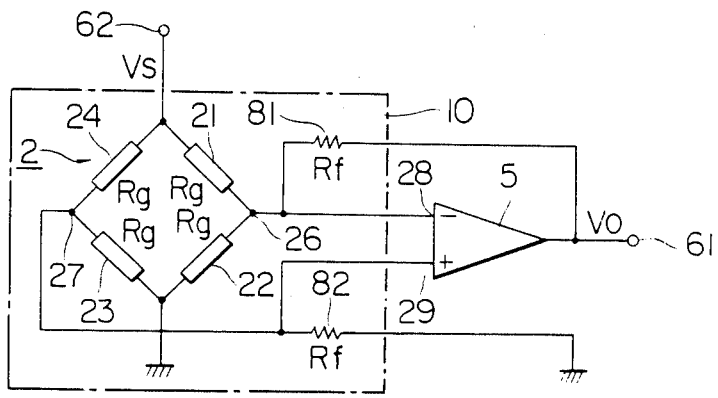
FIG. 4 is a circuit diagram showing an equivalent circuit of a semiconductor transducer according to a first embodiment of the present invention.

In order to understand the present invention well, the conventional problems will be clarified in detail with reference to FIGS. 1 to 3.

FIGS. 1 and 2 show a conventional semiconductor transducer. Referring to FIGS. 1 and 2, a bridge circuit comprises diffusion strain gages 21, 22, 23 and 24 to detect a pressure which is externally applied to a diaphragm 9 formed in a monocrystalline silicon substrate 1. A voltage is applied from a power supply terminal 62 to the bridge circuit 2. A temperature compensator 7 is inserted between the power supply terminal 62 and the bridge circuit 2 to compensate for the temperature sensitivity of the strain gages. An output from the bridge circuit 2 is amplified by a differential amplifier which then generates a voltage in proportion to the pressure. The differential amplifier comprises an operational amplifier 5, a resistor (to be referred to as a series-connected resistor hereinafter) 31 which has one end connected to one of a pair of output terminals of the bridge circuit 2 and the other end connected to the inverting input terminal (−) of the operational amplifier 5, a resistor (to be referred to as a serier-connected resistor hereinafter) 32 which has one end connected to the other pair of output terminals of the bridge circuit 2 and the other end connected to the noninverting input terminal (+) of the operational amplifier 5, and resistors (to be referred to parallel-connected resistors hereinafter) 41 and 42 respectively connected between the inverting input terminal and an output terminal 61 and between the noninverting input terminal and ground.

The following problems are presented:

(1) The gain of the differential amplifier is determined by a ratio of resistances of the series-connected resistors to those of the parallel-connected resistors. A composite resistance component of the strain gages 21, 22, 23 and 24 is added to the resistances of the series-connected resistors 31 and 32, thereby lowering the gain. In order to eliminate the influence of the resistance of the strain gages, the resistances of the series-connected resistors 31 and 32 must be sufficiently higher than that of the composite resistance of the strain gages. In addition, in order to increase the gain, the resistance of the parallel-connected resistors 41 and 42 must be increased. In general, resistors having a resistance of not less than several tons of kilohms are used. In this sense, it is difficult to form the resistors integrally with the strain gages on the monocrystalline silicon substrate 1, thus decreasing the packing density.

(2) Changes in gain of the differential amplifier due to temperature changes occur due to a difference between the temperature coefficients of resistance of the series-connected resistors and the parallel-connected resistors. Generally, the series-connected resistors 31 and 32 and the parallel-connected resistors 41 and 42 are made of the same material, so the difference between the temperature coefficients of resistances thereof is small and can be neglected. However, the strain gages 21, 22, 23 and 24 are connected to the ends of the series-connected resistors 31 and 32, so that the temperature coefficients of the resistances of these resistors must be considered. In the conventional example, changes in gain of the differential amplifier tend to occur. For this reason, the resistances of the series- and parallel-connected resistors must be large such that a change in the composite resistance of the strain gages can be substantially neglected, as in item (1) above. However, the influence of the resistance cannot be substantially eliminated. In order to compensate for the change in resistance, the temperature compensator 7 is inserted. As a result, the circuit arrangement becomes complex. In addition to this disadvantage, this compensator cannot perform highly precise compensation in a wide range of temperature changes.

(3) In order to eliminate the influence of the change in resistance of the strain gages which is presented by items (1) and (2), another conventional transducer shown in FIG. 3 is proposed, wherein a high-input resistance amplifier circuit is used. In this conventional transducer, a number of operational amplifiers are required. When the amplifier circuit is formed together with the strain gages on a monocrystalline silicon substrate, higher integration cannot be obtained.

II. Preferred Embodiments of the Invention

The present invention has been made to solve the above conventional problems, and has as its object to provide a compact, highly integrated semiconductor transducer.

The preferred embodiments of the present invention will now be described in detail with reference to the accompanying drawings. FIG. 4 is an equivalent circuit diagram showing an equivalent circuit of a semiconductor transducer according to a first embodiment of the present invention. Diffusion strain gages 21, 22, 23 and 24 are formed on a monocrystalline silicon substrate 10 to constitute a bridge circuit 2. A voltage is applied from a power supply terminal 62 to the bridge circuit 2, so that a voltage in proportion to the pressure appears across output terminals 26 and 27. The output terminals 26 and 27 are directly connected to an inverting input terminal 28 and a noninverting input terminal 29 of an operational amplifier 5 without being connected through the series-connected resistors, respectively. Parallel-connected resistors 81 and 82 are formed by thermal diffusion on the monocrystalline silicon substrate 10 in the same manner as the diffusion strain gages 21, 22, 23 and 24. One end of the parallel-connected resistor 81 is connected to the inverting input terminal 28 of the operational amplifier 5, and the other end thereof is connected to an output terminal 61. One end of the parallel-connected resistor 82 is connected to the noninverting input terminal 29 of the operational amplifier 5, and the other end thereof is grounded. Each of the resistances of the diffusion strain gages 21, 22, 23 and 24 is preset to be Rg. A change in resistance of the strain gage 21 or 23 which is caused by an externally applied pressure is given to be $+\Delta R$, and a change in resistance of the strain gage 22 or 24 is given to be $-\Delta R$. Each of the resistance of the resistors 81 and 82 parallel-connected to the operational amplifier 5 is given to be Rf. In addition, the power supply voltage is given to be Vs. Under these assumptions, an output voltage V0 appearing at the output terminal 61 is given as follows:

$$V0 = 2(Rf/Rg) \cdot (\Delta R/Rg) \cdot Vs \tag{1}$$

When the externally applied pressure is given to be P, and the pressure sensitivity of the bridge circuit is given to be K, the following equation is given:

$$V0 = 2(Rf/Rg)K \cdot P \cdot Vs \atop \text{for } K \cdot P = \Delta R/Rg \quad (2)$$

When a change in temperature t is also considered, the output voltage V0 is derived as follows:

$$V0 \approx 2(Rf/Rg) \cdot K\{1 + (\alpha f - \alpha g + \beta g) \cdot t\} P \cdot Vs \quad (3)$$

where $\alpha g$ is the temperature coefficient of resistance of each of the strain gages 21, 22, 23 and 24, $\beta g$ is the temperature coefficient of sensitivity of each of the strain gages 21, 22, 23 and 24, and $\alpha f$ is the temperature coefficient of resistance of each of the parallel-connected resistors 81 and 82.

The temperature coefficient of resistance of the output voltage V0 at the operational amplifier 5 is given to be $(\alpha f - \alpha g + \beta g)$. When a difference between the temperature coefficient of resistance $\alpha g$ of each of the strain gages 21, 22, 23 and 24 and the temperature coefficient of sensitivity $\beta g$ thereof becomes equal to the temperature coefficient of resistance $\alpha f$ of each of the parallel-connected resistors 81 and 82, the output voltage V0 at the operational amplifier 5 is free from the influence of temperature.

Figure 6:
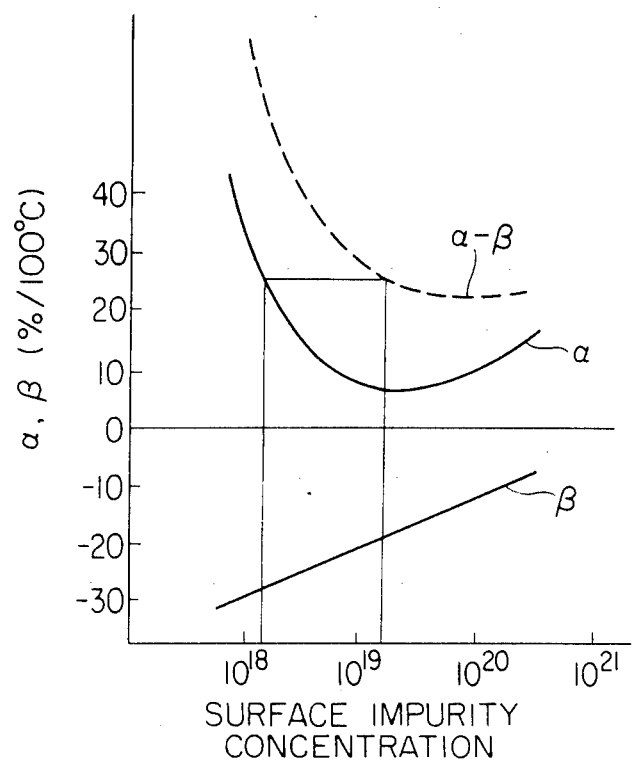
FIG. 6 is a graph showing the relationship between the temperature coefficients of resistance and sensitivity of the p-type diffusion strain gage and the surface impurity concentration.

FIG. 6 is a known graph showing the relationships between the temperature coefficient of resistance $\alpha$ of the p-type diffusion resistor and the surface impurity concentration and between the temperature coefficient of sensitivity $\beta$ of the diffusion strain gage and the surface impurity concentration. A dotted curve indicates the characteristaics of the subtraction value $(\alpha - \beta)$. In order to eliminate the temperature dependency of the output voltage V0, the surface impurity concentration of the strain gages is selected from those along the curve $(\alpha - \beta)$, the surface impurity concentration of the parallel-connected resistors is selected from those along the solid curve $\alpha$, and the selected impurity concentrations are set to be $(\alpha - \beta)$ of the strain gage equal to $\alpha$ of the parallel-connected resistors. This relationship can be easily found from FIG. 6.

For example, when the surface impurity concentration of each of the diffusion strain gages 21, 22, 23 and 24 is set to be $10^{19}$ to $10^{20}$ atoms/cm$^3$ and the surface impurity concentration of each of the parallel-connected resistors 81 and 82 is set to be about $10^{18}$ atoms/cm$^3$, the relation $(\alpha f - \alpha g + \beta g) = 0$ is established, thereby allowing a transducer which is free from temperature dependence to be obtained. In order to obtain the optimum effect of the present invention with high precision, the diffusion strain gages must be kept at the same temperature as that of the parallel-connected resistors. For this purpose, these elements are preferably formed on a single monocrystalline silicon substrate. More preferably, these elements are formed adjacent to each other.

In order to obtain a high gain, the ratio Rf/Rg must be increased, as indicated by equation (1). In association with this, the resistance of the diffusion resistor is substantially inversely proportional to the surface impurity concentration. If a surface impurity concentration of the parallel-connected resistors is selected to be lower than that of the strain gages, a higher gain is obtained.

Figure 5:
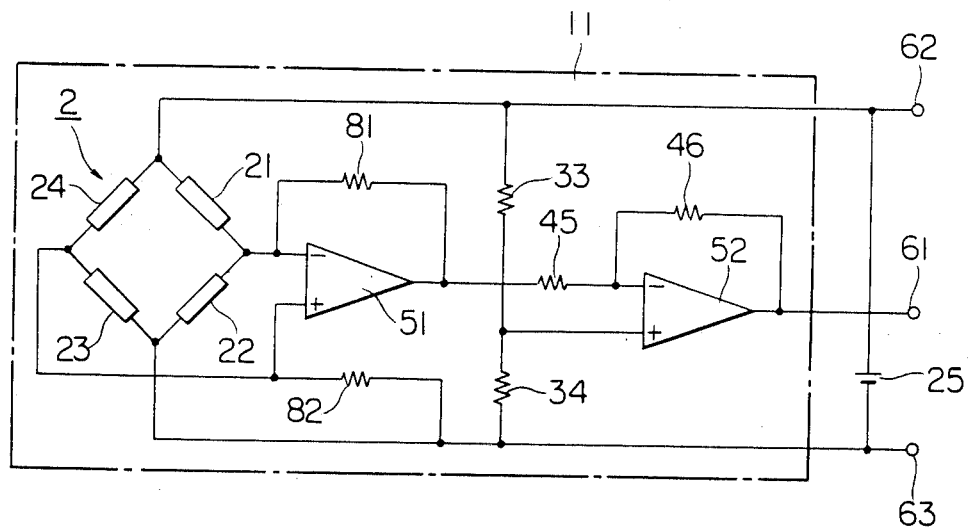
FIG. 5 is a circuit diagram showing an equivalent circuit of a semiconductor transducer according to a second embodiment of the present invention.

FIG. 5 is a circuit diagram showing an equivalent circuit of a semiconductor transducer according to a second embodiment of the present invention. In this embodiment, an amplifier is further added to the transducer shown in FIG. 4. In addition, voltage shunt resistors 33 and 34 are used to constitute a zero control circuit for the output voltage. In this sense, the semiconductor transducer according to the second embodiment becomes more practical than that according to the first embodiment. Diffusion strain gages 21, 22, 23 and 24, operational amplifiers 51 and 52, parallel-connected resistors 81 and 82, the resistors 33 and 34, and resistors 45 and 46 are formed integrally on a monocrystalline silicon substrate 11.

Figure 7:
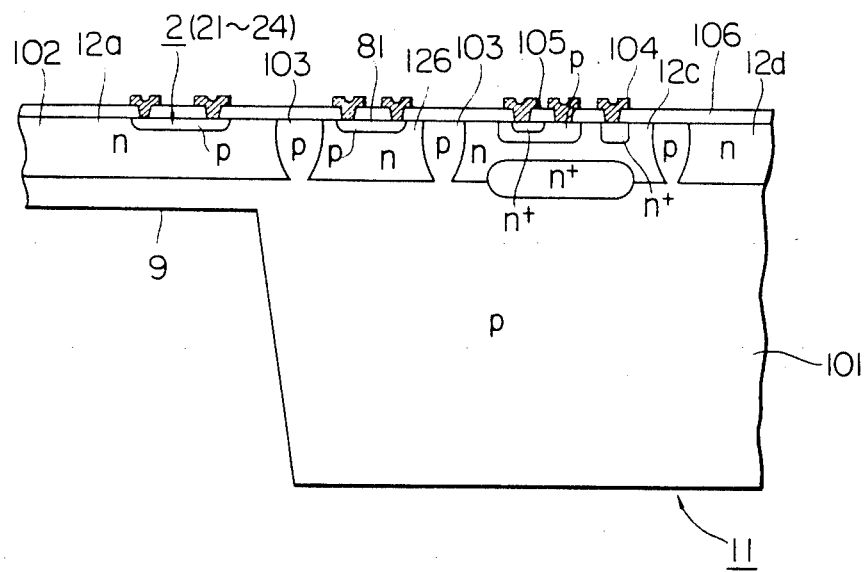
FIG. 7 is a sectional view of the semiconductor transducer according to the second embodiment.

FIG. 7 is a sectional view of the semiconductor transducer according to the second embodiment. FIG. 8 shows the plan and sectional views of this transducer. An epitaxial layer 102 is grown on a monocrystalline silicon base 101 to constitute a monocrystalline silicon substrate 11. Electrical isolation diffusion layers 103 are formed in the major surface to prepare desired element formation regions 12a, 12b, ..., and 12d. The other major surface (rear surface) of the monocrystalline silicon substrate 11 is etched to form a diaphragm 9 as a thin strain sensitive region. For example, the diffusion strain gages 21 to 24, the parallel-connected resistor 81, and an npn transistor 105 are respectively formed in the element formation regions 12a, 12b, ..., and 12d. A silicon oxide film is deposited on the entire surface of the substrate 11 and is patterned to obtain a silicon oxide film pattern 106. An aluminum film is deposited to cover the entire surface and is then patterned to obtain desired aluminum electrodes and leads 104. Only part of the semiconductor transducer is illustrated in FIG. 7. In practice, a plurality of element arrangements are formed to constitute the equivalent circuit shown in FIG. 5.

Referring to FIGS. 5, 7 and 8, the diffusion strain gages are formed by thermal diffusion or ion implantation at a surface impurity concentration of about $1.5 \times 10^{19}$ atoms/cm$^3$. The parallel-connected resistors 81 and 82 are formed by the same method at a surface impurity concentration of about $1.5 \times 10^{18}$ atoms/cm$^3$ so as to obtain the relationship such that the difference between the temperature coefficient of resistance $\alpha g$ of each of the diffusion strain gages 21, 22, 23 and 24 and the temperature coefficient of sensitivity $\beta g$ thereof becomes substantially the same as the temperature coefficient resistance $\alpha f$ of each of the parallel-connected resistors 81 and 82. During the parallel-connected resistor formation process, the other resistors 33, 34, 45 and 46 and the base region of the npn transistor used in the operational amplifier 51 or 52 are also formed.

According to the second embodiment, although the size of the monocrystalline silicon substrate 11 may be as small as 1 mm×3 mm×0.4 mm, the total gain obtained is 100 the input level. An output voltage of 1 to 4 V can be obtained with good linearity when the power supply voltage is set at 5 V and the pressure changes within the range of 0 to 750 mmHg. In addition, although an external temperature compensator is not used, the temperature sensitivity characteristic can be given to be 0.05%/°C. in the temperature range of −30° C. to 110° C.

A third embodiment will be described. FIG. 9 shows the schematic views of a semiconductor transducer according to the third embodiment. The main feature of this embodiment lies in the fact that the effect of the present invention is further emphasized and higher integration can be achieved. A bridge circuit 2 having strain gages 21, 22, 23 and 24 and another bridge circuit 2' having strain gages 21', 22', 23' and 24' are formed on the major surface of a diaphragm 9. The right-hand side portion is an amplifier circuit which comprises operational amplifiers 51 and 52, parallel-connected resistors 81, 82, 83 and 84, and so on and which has a 100 gain. An output voltage can be extracted at an output terminal 61 in level of volts. The left-hand side portion is an amplifier circuit which comprises an operational amplifier 53, parallel-connected resistors 85 and 86, and so on. This amplifier circuit amplifies an output voltage at the bridge circuit 2', and the amplified voltage is converted by a voltage-frequency converter 500 to a frequency signal which represents a change in frequency in proportion to a change in pressure. This frequency signal appears at an output terminal 66. Therefore, the semiconductor transducer is prepared so as to provide a highly precise analog output and a frequency output having a higher signal-to-noise ratio.

FIG. 10 is a sectional view of a package including the semiconductor transducer of the second embodiment or third embodiment so as to detect an absolute pressure. The monocrystalline silicon substrate 11 is bonded to a glass base 73 by a method using glass with a low-melting point or by anodic bonding. A cavity 78 surrounded by the diaphragm 9 and the glass base 73 is held in a vacuum state. The glass base 73 is bonded by an adhesive such as silicone rubber to the bottom of a ceramic case 71. Input/output electrode terminals of the monocrystalline silicon substrate and metallized electrode terminals of the laminated ceramic case 71 are connected through a predetermined number of gold lines 610 by ultrasonic bonding. External leads 601 and 602 are brazed to the metallized electrodes terminals at the external side surfaces of the laminated ceramic case 71. A pressure supply pipe 74 extends through a cap 72 and is brazed therein. The cap 72 is brazed to the upper surface of the laminated ceramic case 71. The structure is hermetically sealed except for the pipe 74.

FIG. 11 is a perspective view of the package shown in FIG. 10. By using the package shown in FIGS. 10 and 11, the semiconductor transducer can be used in the same manner as other commercially available integrated circuits (IC). Therefore, the semiconductor transducer according to the present invention can be handled in the same manner as normal electronic elements. By using the semiconductor transducer, a compact, highly precise manometer or barometer can be prepared.

The above embodiments are confined to pressure detection merely for illustrative convenience and the present invention can also be applied to all semiconductor transducers for detecting strain, load, displacement, torque, and the like.

In the bridge circuit having four strain gages, as described in each of the above embodiments, a series- or parallel-connected resistor can be inserted between the strain gages, as needed, so as to perform zero point control of the bridge circuit or temperature compensation for the output sensitivity. In this case, a composite resistance is used as in the case of the equivalent circuit of the bridge circuit.

What is claimed is:
1. A semiconductor transducer comprising, a monocrystalline silicon substrate,
a strain sensitive region formed on said monocrystalline silicon substrate and having a major surface,
at least one strain gage integrally formed on the major surface of said strain sensitive region,
a bridge circuit including said strain gage, said bridge circuit having an output terminal,
an operational amplifier having an inverting input terminal connected to the output terminal of the bridge circuit, and at least one first parallel-connected resistor having two ends one connected to said inverting input terminal and the other to an output terminal of said operational amplifier, said parallel-connected resistor having a temperature coefficient of resistance set to be substantially the same as the difference between the temperature coefficient of resistance of said strain gage and the temperature coefficient of sensitivity thereof, said bridge circuit, said operational amplifier and said first parallel-connected resistor being formed on said monocrystalline silicon substrate.

2. A semiconductor transducer according to claim 1 wherein at least two said strain gages are integrally formed on said major surface of said strain sensitive region, and a second of said parallel-connected resistors is provided, said second parallel-connected resistor having one end connected to a noninverting input terminal of said operational amplifier, and the other end thereof is grounded, said second parallel-connected resistor having a temperature coefficient of resistance set to be substantially the same as the difference between the temperature coefficient of resistance of the strain gage and the temperature coefficient of sensitivity thereof, said second parallel-connected resistor being formed on said monocrystalline silison substrate.

3. A semiconductor transducer according to claim 2, wherein said operational amplifier is formed on the major surface of said monocrystalline silicon substrate.

4. A semiconductor transducer according to claim 3, wherein said monocrystalline silicon substrate is obtained by forming an epitaxial layer of a first conduction type on a monocrystalline silicon base so as to constitute the major surface, said strain gages and said first and second parallel-connected resistors have a second conduction type and said operational amplifier is formed integrally on the major surface of said monocrystalline silicon substrate.

5. A semiconductor transducer according to claim 4, comprising an electrical isolation diffusion layer formed on the major surface of said monocrystalline silicon substrate, and said strain sensitive region is formed as a diaphragm.

6. A semiconductor transducer according to claim 5, comprising a second operational amplifier connected to the output terminal of the first said operational amplifier and one of the input terminals of the second operational amplifier receives a voltage obtained by shunting a power supply voltage so as to control a zero point.

7. A semiconductor transducer according to claim 6, wherein said first and second parallel-connected resistors are formed in the vicinity of said strain gages.

8. A semiconductor transducer according to claim 7, wherein said bridge circuit is formed in said strain sensitive region, said first and second parallel-connected resistors have a lower surface impurity concentration than that of said strain gages, and an insulating film comprising a silicon oxide film is formed on the major surface of said monocrystalline silicon substrate having elements in said respective element regions.

9. A semiconductor transducer according to claim 3, comprising an electrical isolation diffusion layer formed in the major surface of said monocrystalline silicon substrate to isolate respective element regions from each other.

10. A semiconductor transducer according to claim 9, comprising an insulating film formed on the major surface of said monocrystalline silicon substrate having elements in the respective element regions.

11. A semiconductor transducer according to claim 2, wherein said monocrystalline silicon substrate has a first conduction type, said strain gages and said parallel-connected resistors have a second conduction type.

12. A semiconductor transducer according to claim 11, wherein said operational amplifier is formed on the major surface of said monocrystalline silicon substrate.

13. A semiconductor transducer according to claim 11, wherein said strain sensitive region is formed as a diaphragm.

14. A semiconductor transducer according to claim 13, wherein said bridge circuit is formed in said strain sensitive region, and said strain gages constituting said bridge circuit has the same predetermined resistance.

15. A semiconductor transducer according to claim 14, wherein said first and second parallel-connected resistors are formed in the vicinity of said strain gages.

16. A semiconductor transducer according to claim 15, wherein said first and second parallel-connected resistors have a lower surface impurity concentration than that of said strain gages, and an insulating film comprising a silicon oxide is formed on the major surface of said monocrystalline silicon substrate having elements on said respective element regions.

17. A semiconductor transducer according to claim 2, wherein said first and second parallel-connected resistors have a lower surface impurity concentration than that of said strain gages.

18. A semiconductor transducer according to claim 17, wherein said strain gages have a surface impurity concentration which falls within a range of $10^{16}$ to $10^{21}$ atoms/cm$^3$, and said first and second parallel-connected resistors have a surface impurity which falls within a range of $10^{15}$ to $10^{19}$ atoms/cm$^3$.

19. A semiconductor transducer according to claim 2, wherein said strain sensitive region is formed as a diaphragm.

20. A semiconductor transducer according to claim 2, wherein said strain sensitive region is formed as a beam.

21. A semiconductor transducer according to claim 2, wherein said bridge circuit is formed in said strain sensitive region.

22. A semiconductor transducer according to claim 2, wherein said first and second parallel-connected resistors are formed in the vicinity of said strain gages.

23. A semiconductor transducer according to claim 2, comprising an electrical isolation diffusion layer formed in the major surface of said monocrystalline silicon substrate to isolate respective element regions from each other, and an insulating film formed on the major surface of said monocrystalline silicon substrate having elements in the respective isolated element regions.

24. A semiconductor transducer according to claim 2, wherein four of said strain gages are integrally formed on said major surface of said strain sensitive region.

* * * * *